(12) United States Patent
Kotter et al.

(10) Patent No.: US 7,792,644 B2
(45) Date of Patent: Sep. 7, 2010

(54) METHODS, COMPUTER READABLE MEDIA, AND GRAPHICAL USER INTERFACES FOR ANALYSIS OF FREQUENCY SELECTIVE SURFACES

(75) Inventors: Dale K. Kotter, Shelley, ID (US); David T. Rohrbaugh, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 149 days.

(21) Appl. No.: 11/939,358

(22) Filed: Nov. 13, 2007

(65) Prior Publication Data

US 2009/0125254 A1 May 14, 2009

(51) Int. Cl.
*G01N 31/00* (2006.01)

(52) U.S. Cl. .............................. 702/22; 702/57; 702/75; 702/76

(58) Field of Classification Search .................... 702/57, 702/64–65; 343/756
See application file for complete search history.

(56) References Cited

U.S. PATENT DOCUMENTS

| | | | |
|---|---|---|---|
| 5,313,216 A | 5/1994 | Wang et al. |
| 5,381,157 A | 1/1995 | Shiga |
| 5,436,453 A | 7/1995 | Chang et al. |
| 5,712,647 A | 1/1998 | Shively |
| 5,773,831 A | 6/1998 | Brouns |
| 6,289,237 B1 | 9/2001 | Mickle et al. |
| 6,295,029 B1 | 9/2001 | Chen et al. |
| 6,373,447 B1 | 4/2002 | Rostoker et al. |
| 6,856,291 B2 | 2/2005 | Mickle et al. |
| 6,870,511 B2 | 3/2005 | Lynch et al. |
| 6,882,128 B1 | 4/2005 | Rahmel et al. |
| 6,885,355 B2 | 4/2005 | Killen et al. |
| 6,900,763 B2 | 5/2005 | Killen et al. |
| 6,911,957 B2 | 6/2005 | Brown et al. |
| 6,924,688 B1 | 8/2005 | Beigel |

(Continued)

FOREIGN PATENT DOCUMENTS

WO 2004/093497 A1 10/2004

OTHER PUBLICATIONS

Blackburn, J. and Arnaut, L., Numerical Convergence in Periodic Method of Moments Analysis of Frequency-Selective Surfaces Based on Wire Elements, Aug. 6, 2004, IEEE, vol. 53, No. 10, pp. 3308-3315.*

(Continued)

*Primary Examiner*—Hal D Wachsman
*Assistant Examiner*—Mi'schita' Henson
(74) *Attorney, Agent, or Firm*—TraskBritt

(57) ABSTRACT

A frequency selective surface (FSS) and associated methods for modeling, analyzing and designing the FSS are disclosed. The FSS includes a pattern of conductive material formed on a substrate to form an array of resonance elements. At least one aspect of the frequency selective surface is determined by defining a frequency range including multiple frequency values, determining a frequency dependent permittivity across the frequency range for the substrate, determining a frequency dependent conductivity across the frequency range for the conductive material, and analyzing the frequency selective surface using a method of moments analysis at each of the multiple frequency values for an incident electromagnetic energy impinging on the frequency selective surface. The frequency dependent permittivity and the frequency dependent conductivity are included in the method of moments analysis.

28 Claims, 5 Drawing Sheets

U.S. PATENT DOCUMENTS

| | | | |
|---|---|---|---|
| 6,965,355 | B1 | 11/2005 | Durham et al. |
| 6,977,615 | B2 | 12/2005 | Brandwein, Jr. |
| 7,057,514 | B2 | 6/2006 | Mickle et al. |
| 7,068,225 | B2 | 6/2006 | Schantz |
| 7,070,406 | B2 | 7/2006 | Jeans |
| 7,071,889 | B2 | 7/2006 | McKinzie, III et al. |
| 7,083,104 | B1 | 8/2006 | Empedocles et al. |
| 7,084,605 | B2 | 8/2006 | Mickle et al. |
| 7,088,306 | B2 | 8/2006 | Chiang et al. |
| 7,119,161 | B2 | 10/2006 | Lawandy |
| 7,190,315 | B2 | 3/2007 | Waltho |
| 7,190,317 | B2 | 3/2007 | Werner et al. |
| 7,190,326 | B2 | 3/2007 | Voeltzel |
| 7,228,156 | B2 | 6/2007 | Gilbert |
| 7,250,921 | B1 | 7/2007 | Henry et al. |
| 7,253,426 | B2 | 8/2007 | Gorrell et al. |
| 7,256,753 | B2 | 8/2007 | Werner et al. |
| 2003/0034918 | A1* | 2/2003 | Werner et al. ......... 343/700 MS |
| 2003/0142036 | A1 | 7/2003 | Wilhelm et al. |
| 2003/0214456 | A1 | 11/2003 | Lynch et al. |
| 2003/0230747 | A1 | 12/2003 | Ostergard |
| 2004/0028307 | A1 | 2/2004 | Diduck |
| 2004/0201526 | A1 | 10/2004 | Knowles et al. |
| 2005/0057431 | A1 | 3/2005 | Brown et al. |
| 2005/0247470 | A1 | 11/2005 | Fleming et al. |
| 2005/0253763 | A1 | 11/2005 | Werner et al. |
| 2006/0035073 | A1 | 2/2006 | Funkenbusch et al. |
| 2006/0092087 | A1* | 5/2006 | Lange ..................... 343/782 |
| 2006/0125707 | A1* | 6/2006 | Waschenko ............. 343/790 |
| 2006/0194022 | A1 | 8/2006 | Boutilier et al. |
| 2006/0227422 | A1* | 10/2006 | Monacelli et al. ......... 359/485 |
| 2006/0231625 | A1 | 10/2006 | Cumming et al. |
| 2006/0267856 | A1* | 11/2006 | Voeltzel .................. 343/909 |
| 2007/0077688 | A1 | 4/2007 | Hsu et al. |
| 2007/0132645 | A1 | 6/2007 | Ginn et al. |
| 2007/0159395 | A1 | 7/2007 | Sievenpiper et al. |
| 2007/0170370 | A1 | 7/2007 | Gorrell et al. |
| 2007/0171120 | A1 | 7/2007 | Puscasu et al. |
| 2007/0176832 | A1 | 8/2007 | Qian et al. |
| 2007/0240757 | A1 | 10/2007 | Ren et al. |
| 2009/0121014 | A1* | 5/2009 | Tharp et al. .............. 235/380 |

OTHER PUBLICATIONS

Panteny et al., The Frequency Dependent Permittivity and AC Conductivity of Random Electrical Networks, 2005, Ferroelectrics, 319, pp. 199-208, DOI 10.1080/00150190590965884.*

Monacelli et al., Infrared frequency selective surfaces: design, fabrication and measurement, 2004, Proc. of SPIE, vol. 5406, pp. 879-886, DOI 10.1117/12.542697.*

Frost, Greg, "BC physicists transmit visible light through miniature cable," Boston college, Public release, Jan 8, 2007, 2 pages.

Gates et al., "Unconventional Nanofabrication," Annu. Rev. Mater. Res. 2004, 34:339-72.

Kwon et al., "Efficient Method of Moments Formulation for Large PEC Scattering Problems Using Asymptotic Phasefront Extraction (APE)," IEEE Transaction on Antennas and Propagation, vol. 49, No. 4, Apr. 2001, pp. 583-591.

Monacelli et al., "Infrared frequency selective surfaces: design, fabrication and measurement," SPIE Infrared Technology and Applications XXX conference, Apr. 12-16, 2004 (8 pages).

Monacelli et al., "Infrared Frequency Selective Surface Based on Circuit-Analog Square Loop Design," IEEE Transactions on Antennas and Propagation, vol. 53, No. 2, Feb. 2005, pp. 745-752.

Nanotechnology and Nanomaterials News Database, "Sunlight Antenna for Solar Cells is Focus of Research Agreement," <<www.perfectdisplay.com>> Jun. 10, 2005, 1 page.

Nanotechnology News, "Carbon Nanotube Structures Could Provide More Efficient Solar Power for Soldiers," <<http://www.azonano.com/news.asp?newsID=548>> Jun. 13, 2007, 4 pages.

Nanowerk Spotlight, "Optical antenna with a single carbon nanotube," <<http://www.nanowerk.com/spotlight/spotid=1442.php>> Jun. 13, 2007, 3 pages.

Peters et al., "Method of Moments Analysis of Anisotropic Artificial Media Composed of Dielectric Wire Objects," IEEE Transactions on Microwave Theory and Techniques, vol. 43, No. 9, Sep. 1995, pp. 2023-2027.

Peters, Timothy J., "A Quasi-Interactive Graded-Mesh Generation Algorithm for Finite Element/Moment Method Analysis on NURBS-Based Geometries," IEEE 1994, pp. 1390-1393.

Pierantoni et al., "Theoretical and Numerical Aspects of the Hybrid MOM-FDTD, TLM-IE and ARB Methods for the Efficient Modelling of EMC Problems," 29th European Microwave Conference—Munich 1999, pp. 313-316.

Rahmat-Sammii et al., "Mesh Reflector Antennas with Complex Weaves: PO/Periodic MoM and Equivalent Strip Width Verification," IEEEAC paper #1547, Version 3, Updated Dec. 3, 2006, pp. 1-9.

Research Highlights, "Catching the sun's rays with wire," DOE Pulse, No. 242, Aug. 27, 2007 (2 pages).

Science Daily, "A Sound Way to Turn Heat Into Electricity," <<http://www.sciencedaily.com/releases/2007/06/070603225026.htm>> Jun. 13, 2007, 3 pages.

Wang et al., "Receiving and transmitting light-like radio waves: Antenna effect in arrays of aligned carbon nanotubes," Applied Physics Letters, vol. 85, No. 13, Sep. 27, 2004, pp. 2607-2609.

Jonietz, Erika, "Nano Antenna," Technology Review, <<http://www.technologyreview.com/Nanotech/16024/>> Dec. 2005, 5 pages.

News in Science, "Light excites nano-antenna," <<http://www.abc.net.au/science/news/stories/s1202875.htm>> Sep. 20, 2004, 2 pages.

International Search Report from PCT/US08/83142 dated Jan. 9, 2009, 2 pages.

Written Opinion of the International Searching Authority from PCT/US08/83142 dated Jan. 9, 2009, 6 pages.

International Search Report from PCT/US08/83143 dated Jan. 9, 2009, 2 pages.

Written Opinion of the International Searching Authority from PCT/US08/83143 dated Jan. 9, 2009, 7 pages.

Hooberman, Benjamin, "Everything You Ever Wanted to Know About Frequency-Selective Surface Filters but Were Afraid to Ask," May 2005, pp. 1-22.

U.S. Appl. No. 11/396,744, filed Mar. 26, 2006; Dale Kotter and Chris Lopes, inventors.

* cited by examiner

280

☐ Enter bands to an....  _ ☐ ✕

Band #1 (format=number "space" number)
`3 6`

Band #2 (format=number "space" number)
`6 8`

Band #3 (format=number "space" number)
`8 12`

OK   Cancel

☐ FD Solver  _ ☐ ✕

Name of Trace Layer Material:
`au`

Name of Dielectric Material(s):
`poly1`

Minimum Wavelength to Solve (um):
`3`

Maximum Wavelength to Solve (um):
`12`

Number of Wavelength Sample Points:
`30`

Incident Wave Alpha (degree):
`0`

Incident Wave Eta (degree):
`0.01`

Trace Thickness (um):
`.1`

Dielectric Thickness (um):
`1.25`

Square Loop Loop Width (um):
`0.3`

Square Loop Spacing Gap (um):
`0.3`

Square Loop Periodicity (um):
`3.5`

Advanced Options

Path to Materials:
`C:\Program Files\MATLAB\R2006a\wo`

OK   Cancel

FIG. 6

METHODS, COMPUTER READABLE MEDIA, AND GRAPHICAL USER INTERFACES FOR ANALYSIS OF FREQUENCY SELECTIVE SURFACES

GOVERNMENT RIGHTS

This invention was made with government support under Contract No. DE-AC07-05-ID14517, awarded by the United States Department of Energy. The government has certain rights in this invention.

RELATED APPLICATION

The present application is related to U.S. Provisional Patent Application Serial No. 60/987,630, filed Nov. 13, 2007, and entitled ANTENNA DEVICES COMPRISING FLEXIBLE SUBSTRATES, RELATED STRUCTURES, AND METHODS OF MAKING AND USING THE SAME, and co-pending U.S. patent application Ser. No. 11/939,342, filed Nov. 13, 2007, and entitled STRUCTURES, SYSTEMS AND METHODS FOR HARVESTING ENERGY FROM ELECTROMAGNETIC RADIATION, the disclosures of which are incorporated by reference herein in their entireties.

1. Technical Field

Embodiments of the present invention relate generally to methods for analyzing and designing structures that are responsive to incident electromagnetic energy and, more specifically, for analyzing and designing arrays of electromagnetic scattering elements.

2. Background

Frequency selective surfaces (FSS) are used in a wide variety of applications including radomes, dichoric surfaces, circuit analog absorbers, and meander line polarizers. An FSS is a two-dimensional periodic array of electromagnetic scattering elements. Such scattering elements may be in the form of conductive dipoles, patches, loops or slots. An FSS structure generally includes a metallic grid of scattering elements deposited on a dielectric substrate. Each of the metal patches within the metallic grid defines a receiving unit cell.

An electromagnetic wave incident on the FSS structure will pass through, be reflected by, or be absorbed by the FSS structure. This behavior of the FSS structure generally depends on the electromagnetic characteristics of the metal patches, which can act as small resonance elements. As a result, the FSS structure can be configured to perform as low-pass, high-pass, or dichoric filters. Thus, the resonance elements may be designed with different geometries and different materials to generate different spectral responses.

Conventionally, FSS structures have been successfully designed and implemented for use in Radio Frequency (RF) and microwave frequency applications. It is recognized that several numerical analysis techniques can be employed for electromagnetic analysis. One such technique is a "method of moments" technique, which is a numerical computational method of solving linear partial differential equations associated with electromagnetic fields. Variants of this method of moments analysis may also be referred to as Periodic Method of Moments (PMM), which have been shown to be useful in modeling FSS structures for the radio frequency (RF) spectrum.

However, PMM analysis tools are limited for modeling the behavior of FSS structures in the infrared region and visible light regions. In addition, currently available PMM analysis tools generally perform the analysis at a specific frequency and with a specific FSS structure.

There remains a need in the art for improved methods of modeling, analyzing, and designing FSS structures at frequencies in the infrared and visible light regions of the electromagnetic spectrum, as well as for improved methods for analyzing FSS structures at a range of frequencies and with a range of modifiable parameters for the FSS structures.

BRIEF SUMMARY OF THE INVENTION

An embodiment of the invention comprises a method for analyzing a frequency selective surface. The method includes defining a frequency range including multiple frequency values and determining a frequency dependent permittivity across the frequency range for a substrate included in the frequency selective surface. The method also includes analyzing the frequency selective surface using a method of moments analysis at each of the multiple frequency values for an incident electromagnetic energy impinging on the frequency selective surface to develop a frequency response function. The frequency dependent permittivity is included in the method of moments analysis.

Another embodiment of the invention comprises a method for analyzing a frequency selective surface. The method includes defining a frequency range including multiple frequency values and determining a frequency dependent conductivity across the frequency range for a conductive material included in the frequency selective surface. The method also includes analyzing the frequency selective surface using a method of moments analysis at each of the multiple frequency values for an incident electromagnetic energy impinging on the frequency selective surface to develop a frequency response function. The frequency dependent conductivity is included in the method of moments analysis.

Another embodiment of the invention comprises a Graphical User Interface (GUI) for modeling, analyzing and designing frequency selective surfaces. The GUI includes an interface element for defining a frequency range including multiple frequency values, an element for accessing a frequency dependent conductivity across the frequency range for a conductive material included in the frequency selective surface, and an element for accessing a frequency dependent permittivity across the frequency range for a substrate included in the frequency selective surface. The GUI also includes an element for controlling a method of moments analysis module to analyze, at each of the multiple frequency values, the frequency selective surface for an incident electromagnetic energy impinging on the frequency selective surface. The frequency dependent conductivity and the frequency dependent permittivity are included in the method of moments analysis.

Yet another embodiment of the invention includes a computer readable media including computer executable instructions to be executed on a processor. When executing the computer instruction, the processor defines a frequency range including multiple frequency values, determines a frequency dependent permittivity across the frequency range for a substrate included in a frequency selective surface, and determines a frequency dependent conductivity across the frequency range for a conductive material included in the frequency selective surface. Computing instructions are also included for analyzing the frequency selective surface using a method of moments analysis at each of the multiple frequency values for an incident electromagnetic energy impinging on the frequency selective surface to develop a frequency response function. The frequency dependent permittivity and the frequency dependent conductivity are included in the method of moments analysis.

Yet another embodiment of the present invention is an apparatus comprising a frequency selective surface including a pattern of conductive material formed on a substrate to form an array of resonance elements. At least one aspect of the frequency selective surface is determined by defining a frequency range including multiple frequency values, determining a frequency dependent permittivity across the frequency range for the substrate, determining a frequency dependent conductivity across the frequency range for the pattern of conductive material, and analyzing the frequency selective surface using a method of moments analysis at each of the multiple frequency values for an incident electromagnetic energy impinging on the frequency selective surface. The frequency dependent permittivity and the frequency dependent conductivity are included in the method of moments analysis.

BRIEF DESCRIPTION OF THE SEVERAL VIEWS OF THE DRAWINGS

FIG. 5 is a GUI window illustrating some possible frequency bands that may be selected for post-processing of FSS structure analysis data;

FIG. 6 is a GUI window illustrating some possible parameters that may be defined in analysis of FSS structures.

DETAILED DESCRIPTION OF THE INVENTION

Figure 1A:
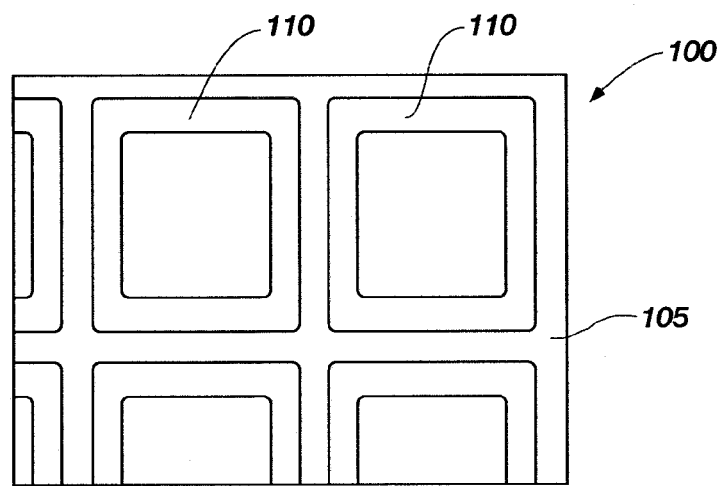
FIGS. 1A-1C are top views of various resonance elements and resonance elements arranged in two-dimensional arrays.

Embodiments of the present invention provide methods and computer readable media for performing analysis and design of FSS structures at frequencies in the infrared, visible light, and up to TeraHertz regions of the electromagnetic spectrum, as well as methods for analyzing FSS structures at a range of frequencies and with a range of modifiable parameters for the FSS structures.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention. It should be understood, however, that the detailed description and the specific examples, while indicating examples of embodiments of the invention, are given by way of illustration only and not by way of limitation. From this disclosure, various substitutions, modifications, additions, rearrangements, or combinations thereof within the scope of the present invention may be made and will become apparent to those skilled in the art.

Software processes and analysis methods illustrated herein are intended to illustrate representative processes that may be performed by a general purpose or special purpose processing system. Unless specified otherwise, the order in which the process acts are described is not intended to be construed as a limitation, and acts described as occurring sequentially may occur in a different sequence, or in one, or more, parallel process streams. It will be appreciated by those of ordinary skill in the art that many steps and processes may occur in addition to those outlined in the flow charts. Furthermore, the processes may be implemented in any suitable hardware, software, firmware, or combinations thereof.

When executed as firmware or software, the instructions for performing the processes may be stored on a computer-readable medium. A computer-readable medium includes, but is not limited to, magnetic and optical storage devices such as disk drives, magnetic tape, CDs (compact disks), DVDs (digital versatile discs or digital video discs), and semiconductor devices, such as RAM (Random Access Memory), DRAM (Dynamic Random Access Memory), ROM (Read-Only Memory), EPROM (Electrically Erasable Programmable Read-Only Memory), and Flash memory.

By way of non-limiting example, computing instructions for performing the processes may be performed on a processing system (not shown). In the processing system, the computing instructions may be stored on operational storage, transferred to a memory for execution, and executed by one or more processors. The one or more processors, when executing computing instructions configured for performing the processes, constitutes structure for performing the processes. In addition, some or all portions of the processes may be performed by hardware specifically configured for carrying out the processes.

An FSS structure is made up of a periodic arrangement of resonant structures (also referred to as antennas, micro-antennas, and nano-antennas). Generally, the FSS structure may be formed by a conductive material formed in a specific pattern on a dielectric substrate to create the resonance elements. These FSS structures may be used for spectral modification of reflected or transmitted incident radiation. The resonant properties of these structures are largely dependent on the structure's layout in terms of shape, dimensions, periodicity, the structure's material properties, and optical parameters of surrounding media. It has been demonstrated that by varying the FSS geometry, material properties, or combinations thereof, that it is possible to tune the resonance of an FSS structure to meet specific design requirements.

Figure 1B:
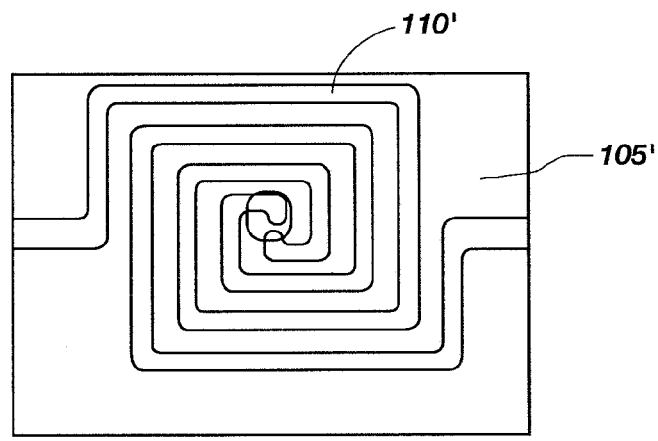
Figure 1C:
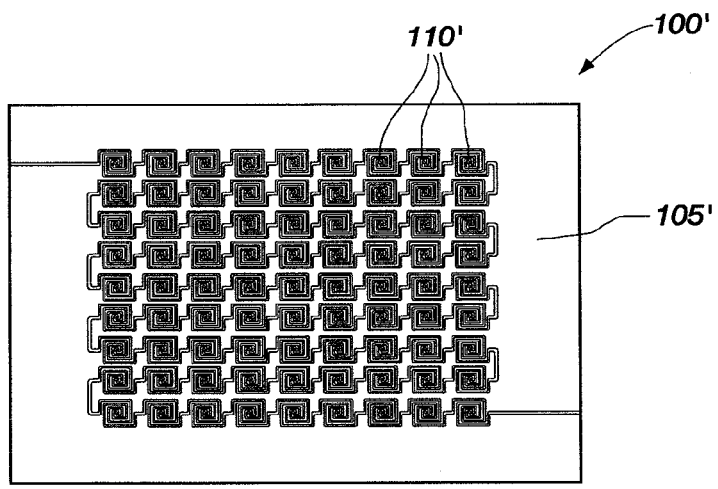

FIGS. 1A-1C are top views of various resonance elements 110 and two-dimensional arrays of resonance elements 110 to form FSS structures 100. FIG. 1A illustrates square loop resonance elements 110 formed on a substrate 105 to create a two-dimensional array of square loop resonance elements 110 that form an FSS structure 100. FIG. 1B illustrates square spiral resonance elements 110' formed on a substrate 105'. FIG. 1C illustrates the square spiral resonance elements 110' of FIG. 1B formed in an array of square spiral resonance elements 110' on a substrate 105' to produce another FSS structure 100'.

The substrate 105 may be any suitable dielectric material. As non-limiting examples, the substrate 105 may be a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. In addition, the semiconductor need not be silicon-based, but may be based on silicon-germanium, silicon-on-insulator, silicon-on-sapphire, germanium, or gallium arsenide, among others.

As other non-limiting examples, the substrate 105 may be a flexible material selected to be compatible with energy transmission of a specific wavelength of light. The substrate 105 may be formed from a variety of flexible materials, such as a thermoplastic polymer or a moldable plastic. By way of other non-limiting examples, the substrate 105 may comprise polyethylene, polyethylene derivatives, polypropylene, acrylic, fluoropolymer, polystyrene, polystyrene derivatives, polymethyl methacrylate (PMMA), polyvinyl chloride, polyvinyl chloride derivatives, polyethylene terephthalate (MYLAR®), polyimide (e.g., KAPTON®), polyolefin, or any other material suitable for use as a substrate 105. In additional embodiments, the substrate 105 may comprise a binder with nanoparticles distributed therein, such as silicon nanoparticles distributed in a polyethylene binder, or ceramic nanoparticles distributed in an acrylic binder. Any type of substrate 105 may be used as long as the substrate 105 is suitable for the desired spectrum of electromagnetic radiation.

The square loop resonance elements 110 may be formed of a conductive material. The conductive material may be a metal or combination of metals such as, for non-limiting examples, manganese (Mn), gold (Au), silver (Ag), copper (Cu), aluminum (Al), platinum (Pt), nickel (Ni), iron (Fe), lead (Pb), tin (Sn), or any other material suitable for use as a conductive material. The conductive material may have a conductivity in the range of $1.0 \times 10^6$ Ohms$^{-1}$ cm$^{-1}$ to $106.0 \times 10^6$ Ohms$^{-1}$ cm$^{-1}$.

There are many geometric configurations that may be suitable as resonance elements 110. As non-limiting examples, some of these geometries are square loops, circular loops, concentric loops, square spirals, circular spirals, slots, and crosses.

Although the analysis of the FSS structure behavior can be approximated with analog methods such as RLC (Resistance, Inductance, and Capacitance) lumped component theory, more complex numerical analysis methods are required to evaluate the many variables more accurately and develop a more accurate model of an FSS structure 100. One such analysis method is known in the art as a method of moments analysis, which may be used for periodic arrays and is often termed a Periodic Method of Moments (PMM) analysis.

However, PMM analysis has conventionally been applied to FSS structures 100 targeted for the millimeter-wave and radio frequency spectra and the PMM models have been designed to perform at a single selected frequency. In addition, at these relatively lower frequencies, the individual materials making up the FSS structure 100 may exhibit substantially homogeneous behavior when excited by incident radiation. However, at higher frequencies, the materials may behave differently at different frequencies. For example, antenna metals at IR (infrared) wavelengths exhibit electromagnetic conductivity properties that depend on frequency. In other words, the majority of metals commonly used in FSS structures 100 exhibit measurable dispersive properties at IR and visible wavelengths, which may result in a significant modification in the resonance characteristics of a nano-antenna.

As a result, there is a need for methods to enhance conventional PMM models with the ability to analyze and model changes in behavior of materials that may have different electro-optical properties at different frequencies.

There is also a need to enhance conventional PMM models with the ability to repeatedly perform (also referred to herein as "sweep") the PMM analysis over a range of frequencies with user-selectable step sizes for the frequencies to develop an analysis result that can be readily visualized across the desired frequency range.

There is also a need to enhance conventional PMM models with the ability to repeatedly perform (also referred to herein as "sweep") the PMM analysis over a range of values for parameters that may affect the analysis result.

Finally, there is a need to enhance conventional PMM models with the ability to use statistical analysis tools to post process the PMM analysis results to present specific areas that may be of interest to a person designing, modeling, and analyzing various FSS structures 100.

One way to obtain electro-optical properties of the materials used in FSS structures 100 is to characterize the materials using variable-angle ellipsometry analysis and measurement. The resulting characterization data from the ellipsometry analysis may then be incorporated into a frequency dependent PMM analysis.

Figure 2A:
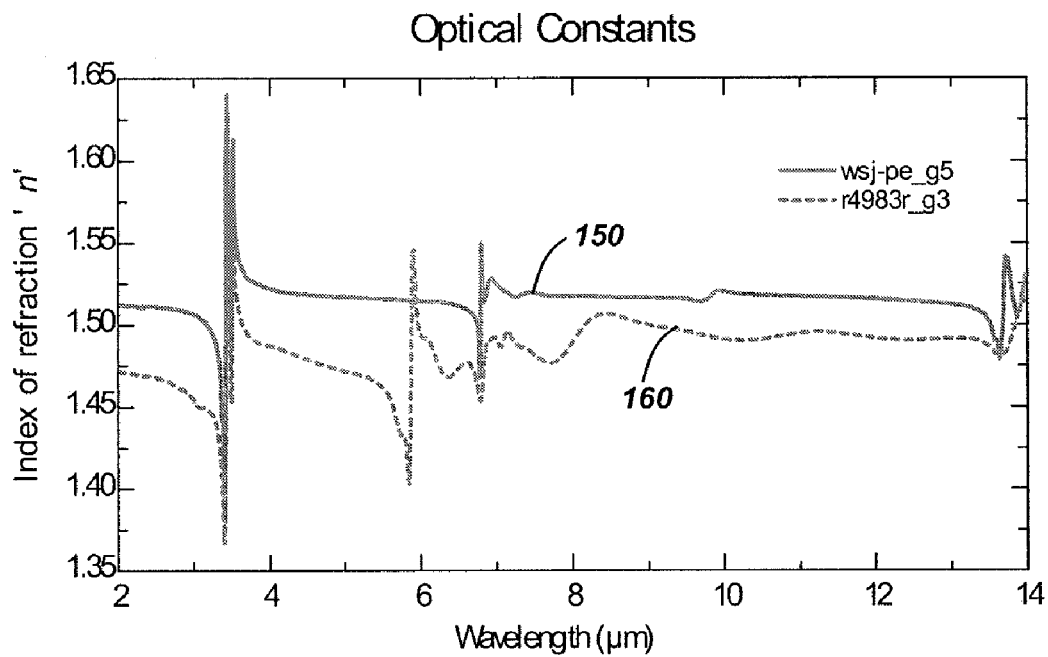
FIGS. 2A and 2B are graphs illustrating values for optical constants as a function of wavelength.
Figure 2B:
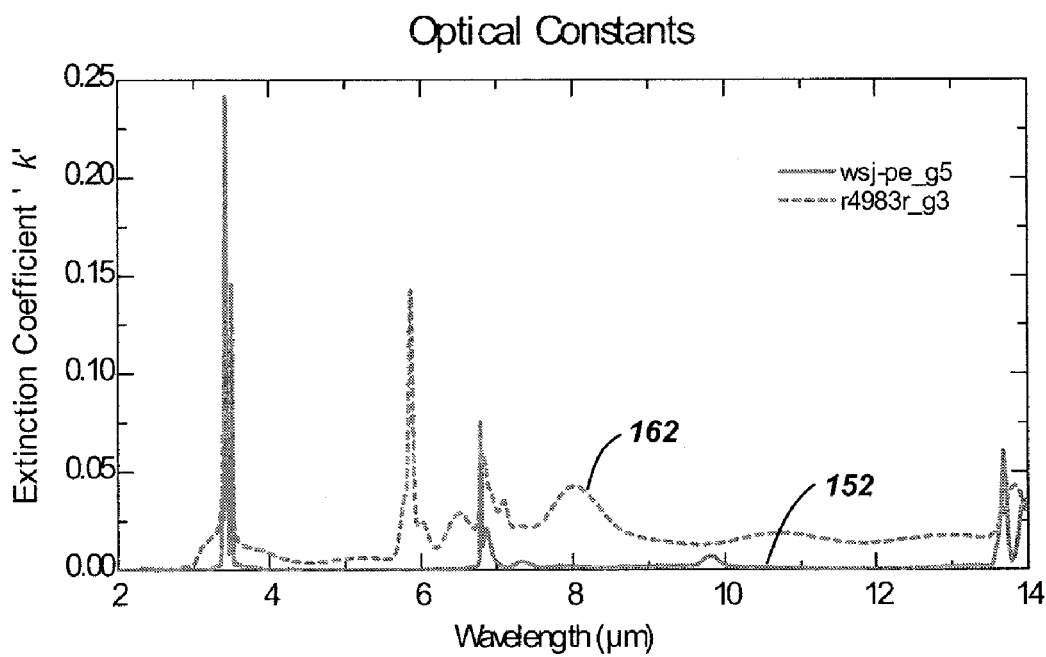

FIGS. 2A and 2B are graphs illustrating values for optical constants as a function of wavelength for two different types of polyethylene materials. As a non-limiting example, for IR frequencies (and, thus, wavelengths—noting that wavelength and frequency are directly related for electromagnetic waves), variable-angle IR ellipsometry may be used to measure real and imaginary parts of permittivity from 1-30 microns for materials of interest. The resulting data may then be processed and stored as libraries of data available for processing in the PMM analysis. In FIGS. 2A and 2B, a first polyethylene material is represented by an index of refraction 150 and an extinction coefficient 152. A second polyethylene material is represented by an index of refraction 160 and extinction coefficient 162.

Ellipsometry is an optical measurement technique for the investigation of the dielectric properties of thin films. Some of these properties that may be of interest are the complex refractive index or dielectric function. As an optical technique, spectroscopic ellipsometry is generally non-destructive and operates without contacting the material being evaluated.

Optical constants of isotropic materials can be described using two parameters. These values characterize how a material responds to excitation by electromagnetic radiation of a given wavelength. One representation is the complex index of refraction $\tilde{n}$, where the real part n is the index of refraction and the imaginary part, k, is the extinction coefficient. The mathematical relationship is: $\tilde{n} = n + ik$.

The index of refraction, n, describes the phase velocity of light in a material compared to propagation in vacuum. The absorption of light is governed by the extinction coefficient, k. In other words, the complex index of refraction $\tilde{n}$ is a measure of how well a material reflects incident electromagnetic radiation and the extinction coefficient k is a measure of how well the material scatters and absorbs electromagnetic radiation. If the electromagnetic (EM) wave can pass through the material easily, the material has a low extinction coefficient. Conversely, if the radiation hardly penetrates the material, but rather quickly becomes "extinct" within it, the extinction coefficient is high. These coefficients of refraction and extinction may also be used to determine the amount of light reflected and transmitted at an interface between two materials.

As a non-limiting example, for some materials ellipsometry measurements were performed at several angles of incidence (e.g., 60°, 70° and 75°). For this non-limiting example, beam diameter was fixed at 6 mm. FIGS. 2A and 2B are graphs illustrating values for optical constants as a function of frequency for two different types of polyethylene materials. As a non-limiting example, for IR frequencies, variable-angle IR ellipsometry may be used to measure real and imaginary parts of permittivity from 1-30 microns for materials of interest. The resulting data may then be processed and stored as libraries of data available for processing in the PMM analysis.

For compatibility with conventional model algorithms, it may be useful to convert wavelength units to frequency and the optical constants 'n' and 'k' to complex permittivity (epsilon real and epsilon imagery). The mathematical relationship between the optical constants and complex permittivity is:

Epsilon (real)=$n^2-k^2$
Epsilon (imagery) $2n*k$
where:
n=reflection coefficient;
k=extinction coefficient;

Thus, the frequency dependent permittivity for the dielectric substrate 105 over a range of frequencies may be stored in a table for access by the PMM model.

The ellipsometry data collected may be processed differently for the dielectric substrate 105 and the conductive materials. For conductive materials, the parameter of interest is sheet resistance, which may be characterized as impedance, conductance, or admittance of the conductive material at various frequencies.

In the IR and visible light frequency range, electrical characteristics of conductive materials may vary for a lossy (i.e., absorbing) FSS conductive layer. Conventionally, FSS conductive layers have simply been modeled by a DC resistivity characterization of a metal via, for example, a four-point probe. This simple resistivity characterization may be adequate for microwave frequencies. However, at IR, near-IR, and visible light frequencies, DC resistivity values of conductive films may not scale uniformly to IR and visible light resistivity values.

Therefore, embodiments of the disclosure provide a method for calculating material conductivity from the ellipsometry refractive index data. This frequency dependent conductivity analysis provides more accurate modeling of the frequency dependent behavior of the FSS conductive layer and aids in impedance matching calculations.

The mathematical relationship between the optical constants and conductivity is:

Conductivity=$(2n*k*\mu o*2\pi*c0)$/wavelength (meters)
where:
n=reflection coefficient;
k=extinction coefficient;
$\mu$=Permittivity of free space=$8.854 \times 10^{-12}$; and
$c_0$ = Speed light in vacuum =$3 \times 10^8$ meters/sec.

Thus, the ellipsometry information including reflection coefficient and extinction coefficient gathered at frequency values within a frequency range of interest may be used to determine a frequency dependent conductivity across the frequency range of interest. This frequency dependent conductivity may be stored in a table for access by the PMM model.

In general, the method of moments is a mathematical technique for solving inhomogeneous linear equations and is especially suited for analysis of periodic arrays of nano-antennas. To accomplish this, the field scattered by the antenna may be represented as an integral of the unknown surface currents on the reflecting surface. The reflecting surface may then be divided into small patches, which are sometimes referred to as modes. Then, by modal analysis, current across the reflecting surface may be represented as a sum of current components along two orthogonal directions. Plane wave expansion may be used to solve the electromagnetic boundary conditions derived from Maxwell's equations for each patch, which may be expanded to find the unknown surface current density over the entire surface. The result is a coupled system of equations accounting for the electromagnetic interaction of every segment with every other segment on the surface. As a result, a PMM model can predict a complete antenna pattern at all points in space by taking into account the effect of the antenna geometry, antenna materials and the surrounding media.

Thus, PMM models a periodic array of elements, via the mutual impedance and plane-wave expansion techniques, using a single reference antenna element as the basis. The voltage induced on the reference element by the rest of the array may be calculated by the following equation:

$$V^{m,array} = I \frac{Z_m}{2D_x D_y} \sum_{-\infty}^{\infty} \sum_{-\infty}^{\infty} \frac{e^{-j\frac{2\pi}{\lambda}R \cdot r_\pm}}{\cos\alpha} (\bar{e}_\pm P^{array}) \cdot \hat{p}^m P^n \cdot T$$

Within this equation:
the $V^{m,array}$ term includes variables defining the inter-element spacing (i.e., "pitch") between the elements;
the $\hat{p}^m p^m$ term includes variables defining the real and imaginary parts of the permittivity of the dielectric substrate 105;
the $Z_m/(2D_x D_y)$ term includes variables defining the element impedance (or, as in the inverse, conductivity) of the conductive material in the resonant structure; and
lambda is the variable defining wavelength (or, as the inverse, frequency).

Embodiments of the present invention include methods for automating a process of performing the PMM analysis across a range of frequencies for the incident electromagnetic energy by "sweeping" through a set of frequencies within a desired frequency range and performing the PMM analysis at each frequency within the set. In addition, frequency dependent values for conductivity of the conductive material and permittivity of the dielectric substrate 105 may be incorporated into the model based on the information obtained previously, through, as a non-limiting example, the ellipsometry analysis.

Furthermore, to assist in design optimization and analysis, the process may be automated by sweeping through other parameters that may affect the model and overall response of the FSS structure 100 being modeled. Thus, as non-limiting examples, parametric sweeps may be performed for resonance element geometry such as outer dimensions, thickness of the conductive material, thickness of the dielectric material, gaps between square loop resonance elements 110, and pitch between square loop resonance elements 110. Other parametric sweeps may include parameters such as angle of incidence for the incident electromagnetic energy.

In general, the incident electromagnetic energy may be absorbed by, transmitted through, or reflected by the FSS structure 100. The result of a conventional PMM model is in units of reflectivity for the excited FSS structure 100. The magnitude of reflectivity may be expressed in terms of decibels (dB). In analysis and optimization, it may be more useful to understand the emissivity properties of the FSS structure 100.

Emissivity may be derived from the reflectivity by the following equation:

Emissivity $10^{(Re/10)}$

Wherein, Re =reflectivity.

Figure 3:
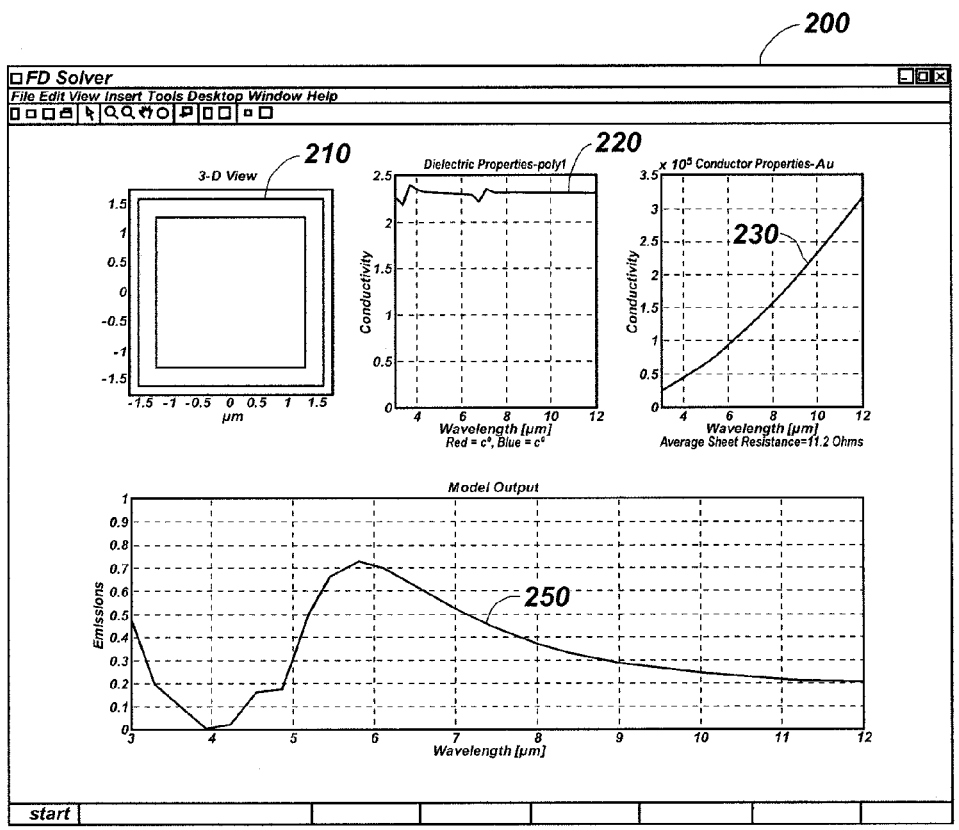
FIG. 3 illustrates a Graphical User Interface (GUI) showing some parameters and results used in analyzing FSS structures.

FIG. 3 illustrates a Graphical User Interface (GUI) 200 showing some parameters and results used in analyzing FSS structures 100. The GUI 200 may include dialog windows and forms to control the geometry and modeling parameters of the FSS design. Each parameter can be entered as single values for fixed sweeping or array values for parametric sweeping. Interactive menus may be used to guide a Design Engineer through setup of the "design and modeling" parameters.

As a non-limiting example, windows of the GUI 200 of FIG. 3, illustrate a resonance element geometry window 210, a dielectric properties window 220, a conductive material window 230, and a model output window 250.

The resonance element geometry window 210 may be used to view geometries of the resonance element in two-dimensional and three-dimensional views. FIG. 3 illustrates a two-dimensional top view of a square loop resonance element. The dielectric properties window 220 may be used to show the permittivity characteristics of a dielectric property across a selected frequency range for the currently defined FSS structure 100 (not shown). In the case of FIG. 3, the dielectric is a type of polyethylene. Similarly, the conductive material window 230 may be used to show the conductance characteristics of a conductive material across a selected frequency range for the currently defined FSS structure 100. The conductive material window 230 may also display the average impedance of the conductive material. In the case of FIG. 3, the conductive material is gold. The model output window 250 may be used to illustrate output properties of the currently defined FSS structure 100. In the FIG. 3 embodiment, the model output window 250 illustrates the emissivity of the FSS structure 100 across a selected frequency range.

Figure 4:
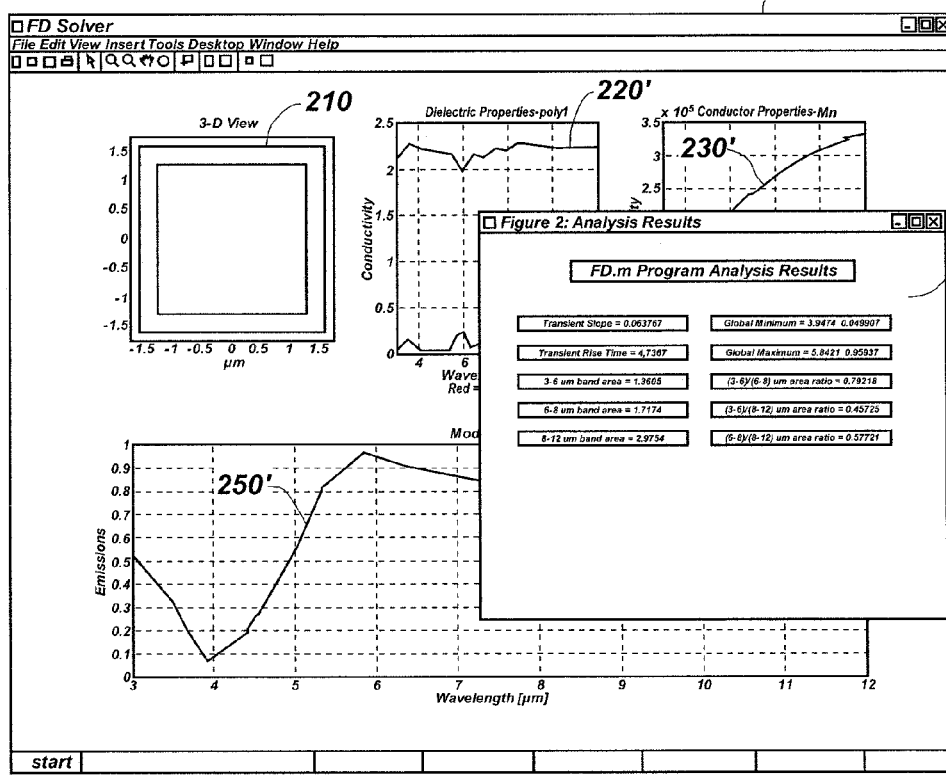
FIG. 4 illustrates the GUI of FIG. 3 showing some parameters and results for another FSS structure and a window indicating some analysis results.

FIG. 4 illustrates the GUI 200 of FIG. 3 showing some parameters and results for another FSS structure 100 (FIG. 1) and a window indicating some analysis results. In FIG. 4, the dielectric properties window 220' illustrates frequency dependent permittivity characteristics for another type of polyethylene and the conductive material window 230' illustrates frequency dependent conductivity for manganese. The model output window 250' illustrates the frequency response function for a square loop resonance element 110 fabricated with manganese on the polyethylene substrate 105.

FIG. 4 also illustrates a program analysis results window 260, which may be displayed as a result of clicking on the model output window 250' or by other suitable means. The program analysis results window 260 displays post processing analysis that may be performed on the model output results. The post processing analysis may be used to provide "figures of merit" for quantifying performance of the FSS structure 100. As non-limiting examples, some of the analyses that may be performed include: a numerical integration of energy through a trapezoidal method, an adaptive Simpson's quadrature, or other acceptable method; calculating rise time/slope of transition between bands; calculating percent modulation between bands; finding global maximum and global minimum of the signal; and providing data logging and GUI reporting of the experimental results.

The post processing also provides a capability to perform a windowed analysis on specific frequency bands of interest. As non-limiting examples, these bands may include the mid-wavelength infrared (MWIR) band (3 μm to 5 μm), the atmospheric pass band (5 μm to 8 μm), and the long-wavelength infrared (LWIR) band (8 μm to 12 μm). FIG. 5 is a band selection GUI window 280 illustrating some possible frequency bands that may be selected for post-processing of FSS structure analysis data.

FIG. 6 is a parameter selection window 270 illustrating some possible parameters that may be defined in analysis and sweeping of FSS structures 100. An operator (not shown) may have control over the FSS design including the capability to select the type of antenna metal and to select the type of dielectric materials. A design tool can be further customized for various FSS designs such as, for example, over coats, and multi-level antenna elements, as is explained more fully below. While not illustrated, the GUI 200 may support custom configuration and selection of various antenna geometries such as square loop, slots, crosses, spiral, etc.

The GUI 200 supports the capability to select regions of the electromagnetic spectrum for analysis. Within these selected regions, the GUI and PMM model provide the capability to sweep the frequency ranges and to select the resolution (i.e., frequency steps) of the parametric sweeps.

As non-limiting examples, the parameter selection window 270 illustrates parameters (and selected values) such as, type of trace material (Au), type of dielectric material (poly1), minimum wavelength to solve (3 microns), maximum wavelength to solve (12 microns), number of wavelength sample points (30), incident wave alpha angle (0 degrees), incident wave eta angle (0.01 degrees), dielectric thickness (1.25 microns), square loop (e.g., element or trace) width (0.3 microns), square loop spacing gap (0.3 microns), and square loop periodicity (3.5 microns). It is noted that the displayed values are merely examples and should not be considered limiting in any sense.

Of course, other parameters may be included. In addition, parameter ranges may be included such that parametric sweeps may be performed on the parameter ranges. As non-limiting examples, parametric sweeps may be desired for incident wave angles, conductor trace thickness, resonance element spacing gaps, periodicity, and dielectric thickness.

Figure 7:
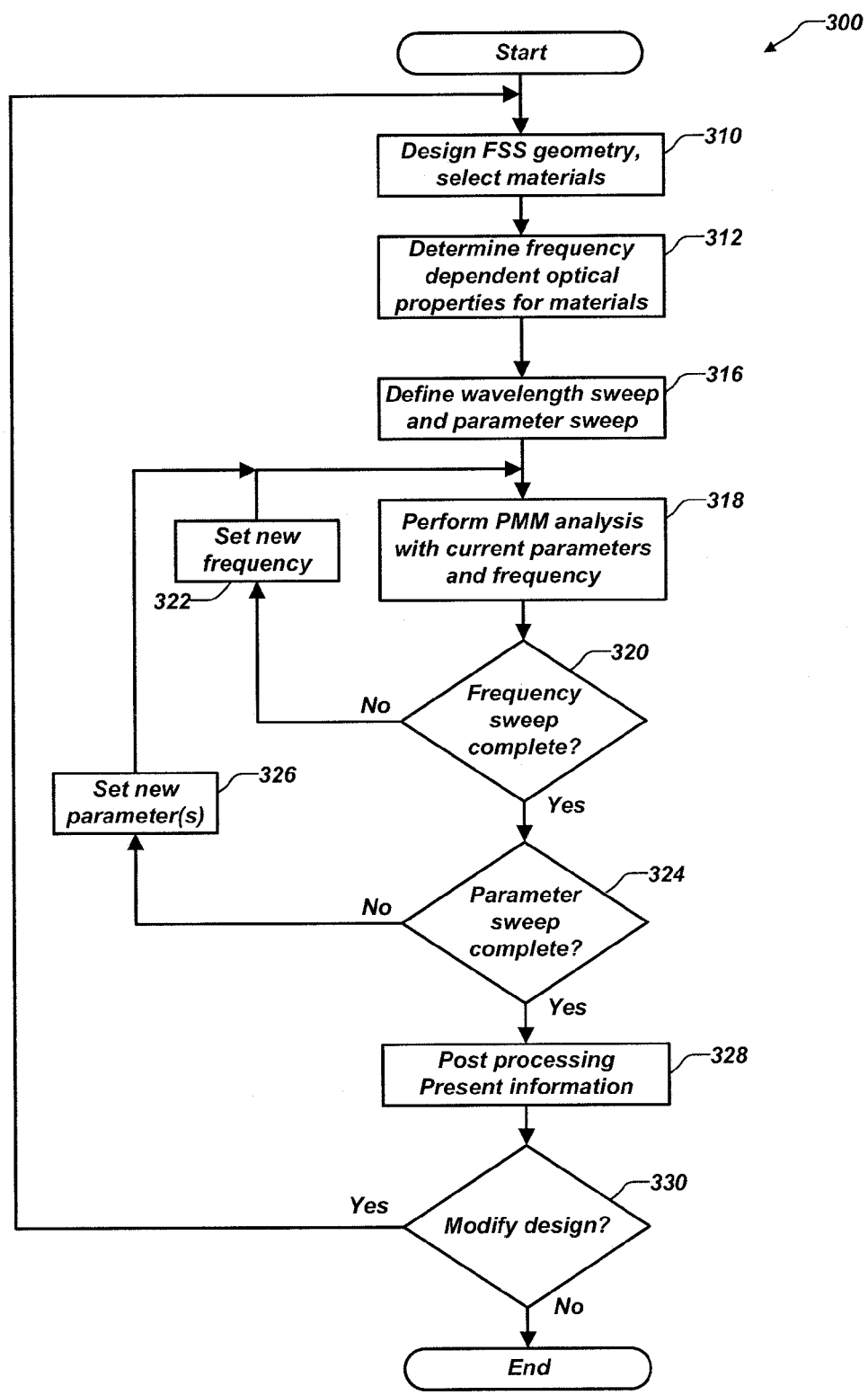
FIG. 7 is a simplified flow chart illustrating some of the processing acts that may occur during analysis and design of FSS structures.

FIG. 7 is a simplified flow chart illustrating some of the processing acts that may occur during an analysis and design method 300 of FSS structures 100. In describing process 300, reference also may be made to elements illustrated in FIGS. 1A-1C. In operation block 310, the operator designs the geometry for the square loop resonance elements 110 and selects materials for the substrate 105 and conductive traces. In operation block 312, frequency dependent electro-optical properties of the materials may be determined by, as a non-limiting example, ellipsometry. Of course, operation block 312 may be performed prior to the analysis and design method 300. For example, a database of frequency dependent properties for a variety of materials may be developed and maintained. The database may then be consulted based on which materials and frequencies were selected for the current design.

Operation block 316 indicates that the wavelength sweep and parameter sweeps may be defined. By way of non-limiting example, the operator may select to sweep the wavelength from 2 microns to 15 microns in 30 equally spaced steps. The operator may also select to sweep from a dielectric thickness of one micron to two microns in 5 equally spaced steps.

Operation block 318 indicates that the PMM analysis is performed with currently selected parameters and at the current frequency. The PMM analysis result for each time through the analysis loop may be saved in a database for additional post processing.

Decision block 320 tests to determine if the frequency sweep is complete. If not, operation block 322 sets the new frequency to the next step in the frequency sweep, and operation block 318 repeats the PMM analysis.

If the current frequency sweep is complete, decision block 324 tests to determine if parametric sweeps are complete. If not, operation block 326 sets the current parameter to the next step in the parameter sweep. Alternatively, if the parameter sweep for the current parameter is complete, but there are more parameters to sweep through, operation block 322 sets the beginning of a new parametric sweep. After the new parameter value is set, flow returns to operation block 318 to perform a new frequency sweep with the new parameter value.

If all parameter sweeps are complete, as determined by decision block 324, operation block 328 performs post processing on the information gathered from the various sweeps, as was described above. Operation block 328 may be an interactive process wherein the operator examines many different aspects of the design and the frequency response function to determine if additional analysis or design modifications should be performed. Decision block 330 indicates that if the design should be modified, or additional analysis performed, control returns to operation block 310 to begin a new design and analysis process. Otherwise, the analysis and design method 300 is complete.

Returning to FIGS. 1A-1C, it is noted that an overcoat (not shown) may be formed over the FSS structure 100. As a non-limiting example, the overcoat may comprise a flexible material such as polyethylene, silicon nanoparticles dispersed in a polyethylene binder, polypropylene, MYLAR®, or KAPTON®. In some embodiments, the overcoat may be a protective material that protects the FSS structure 100 from environmental damage such as corrosion caused by moisture or caustic chemicals. In addition, the overcoat may be analyzed for electro-optic properties and included in the PMM analysis. In this manner, the overcoat may be used to emulate environmental conditions that could influence the resonance properties of the resonance elements 110. Thus, inclusion of the overcoat in the PMM analysis may be used to emulate changes in the resonance property of the FSS structure 100 when it is exposed to environmental conditions. As non-limiting examples, these environmental conditions may include humidity, cold temperatures, and hot temperatures.

While not illustrated, FSS structures 100 may be stacked to create a new FSS structure including a "sandwich" of two or more layers of FSS structures 100. For example, an FSS structure 100 with the square loop resonance elements 110 of FIG. 1A may be stacked on an FSS structure 100' with the square spiral resonance elements 110' to form a new FSS structure. This new FSS structure may then be modeled with the PMM analysis and parametric sweeps described earlier.

Although the present invention has been described with reference to particular embodiments, the present invention is not limited to these described embodiments. Rather, the present invention is limited only by the appended claims, which include within their scope all equivalent devices or methods that operate according to the principles of the present invention as described.

What is claimed is:

1. A method for analyzing a frequency selective surface wherein at least one act of the method is performed by a processing system, comprising:
   defining a frequency range comprising a plurality of frequency values within the frequency range;
   determining a frequency dependent permittivity for each of the plurality of frequency values across the frequency range for a substrate included in a frequency selective surface;
   determining a frequency dependent conductivity for each of the plurality of frequency values across the frequency range for a conductive material included in the frequency selective surface;
   analyzing the frequency selective surface using a method of moments analysis at each of the plurality of frequency values for an incident electromagnetic energy impinging on the frequency selective surface by including the frequency dependent permittivity and the frequency dependent conductivity in the method of moments analysis to develop a frequency response function;
   defining a geometry of the frequency selective surface comprising the substrate and the conductive material disposed on the substrate to form an array of resonance elements; and
   determining an emissivity of the frequency selective surface at each of the plurality of frequency values using the frequency dependent permittivity properties of the substrate and the frequency dependent conductivity properties of the conductive material.

2. The method of claim 1, wherein determining the frequency dependent permittivity across the frequency range for the substrate further comprises:
   determining the frequency dependent permittivity for the substrate comprising a dielectric material selected from the group consisting of polyethylene, polyethylene derivatives, polypropylene, acrylic, fluoropolymer, polystyrene, polystyrene derivatives, polymethyl methacrylate, polyvinyl chloride, polyvinyl chloride derivatives, polyethylene terephthalate, polyimide, polyolefin, silicon, and gallium arsenide.

3. The method of claim 1, further comprising performing the analysis of the frequency selective surface for a parameter of interest at each of a plurality of parameter values to develop a plurality of corresponding frequency response functions for each parameter value of the plurality.

4. The method of claim 3, further comprising selecting the parameter of interest from the group consisting of angle of incidence for the incident electromagnetic energy, conductive material thickness, conductive material trace width, substrate thickness, resonance element size, resonance element periodicity, and spacing between resonance elements.

5. The method of claim 1, wherein analyzing the frequency selective surface further comprises including electro-optic properties of an overcoat disposed over the frequency selective surface structure and configured to emulate at least one environmental condition.

6. The method of claim 1, wherein:
   the frequency selective surface includes at least two stacked layers of frequency selective surfaces wherein a layer of the at least two stacked layers includes at least one resonance element exhibiting a first geometry and a second layer of the at least two stacked layers includes at least one resonance element exhibiting a second geometry different from the first geometry; and
   wherein analyzing the frequency selective surface further comprises analyzing the combination of the at least two stacked layers.

7. A method for analyzing a frequency selective surface wherein at least one act of the method is performed by a processing system, comprising:
   defining a frequency range comprising a plurality of frequency values within the frequency range;
   determining a frequency dependent permittivity for each of the plurality of frequency values across the frequency range for a substrate included in a frequency selective surface;
   analyzing the frequency selective surface using a method of moments analysis at each of the plurality of frequency values for an incident electromagnetic energy impinging on the frequency selective surface by including the frequency dependent permittivity in the method of moments analysis to develop a frequency response function; and
   analyzing the frequency response function to determine at least one filter response coefficient selected from the group consisting of major peaks, magnitude, trapezoidal integration of area under the response curve, ratios of user-specified regions of the plot, transient slope and response time of the filter response.

8. The method of claim 7, wherein determining the frequency dependent permittivity across the frequency range for the substrate further comprises:

determining the frequency dependent permittivity for the substrate comprising a dielectric material selected from the group consisting of polyethylene, polyethylene derivatives, polypropylene, acrylic, fluoropolymer, polystyrene, polystyrene derivatives, polymethyl methacrylate, polyvinyl chloride, polyvinyl chloride derivatives, polyethylene terephthalate, polyimide, polyolefin, silicon, and gallium arsenide.

9. The method of claim 7, further comprising performing the analysis of the frequency selective surface for a parameter of interest at each of a plurality of parameter values to develop a plurality of corresponding frequency response functions for each parameter value of the plurality.

10. The method of claim 9, further comprising selecting the parameter of interest from the group consisting of angle of incidence for the incident electromagnetic energy, conductive material thickness, conductive material trace width, substrate thickness, resonance element size, resonance element periodicity, and spacing between resonance elements.

11. The method of claim 7, wherein analyzing the frequency selective surface further comprises including electro-optic properties of an overcoat disposed over the frequency selective surface structure and configured to emulate at least one environmental condition.

12. The method of claim 7, wherein:

the frequency selective surface includes at least two stacked layers of frequency selective surfaces wherein a layer of the at least two stacked layers includes at least one resonance element exhibiting a first geometry and a second layer of the at least two stacked layers includes at least one resonance element exhibiting a second geometry different from the first geometry; and wherein analyzing the frequency selective surface further comprises analyzing the combination of the at least two stacked layers.

13. A method for analyzing a frequency selective surface wherein at least one act of the method is performed by a processing system, comprising:

defining a frequency range comprising a plurality of frequency values within the frequency range;

determining a frequency dependent conductivity for each of the plurality of frequency values across the frequency range for a conductive material included in a frequency selective surface; and analyzing the frequency selective surface using a method of moments analysis at each of the plurality of frequency values for an incident electromagnetic energy impinging on the frequency selective surface by including the frequency dependent conductivity in the method of moments analysis to develop a frequency response function.

14. The method of claim 13, wherein determining the frequency dependent conductivity across the frequency range for the conductive material further includes determining the frequency dependent conductivity for the conductive material in the range of $1.0 \times 10^6$ Ohms$^{-1}$ cm$^{-1}$ to $106.0 \times 10^6$ Ohms$^{-1}$ cm$^{-1}$.

15. The method of claim 13, further comprising determining a frequency dependent permittivity for each of the plurality of frequency values across the frequency range for a substrate included in the frequency selective surface, and wherein the analyzing the frequency selective surface further comprises including the frequency dependent permittivity in the method of moments analysis at each of the plurality of frequency values.

16. The method of claim 13, further comprising:

defining a geometry of the frequency selective surface comprising a substrate and the conductive material disposed on the substrate to form an array of resonance elements; and wherein determining an emissivity of the frequency selective surface at each of the plurality of frequency values responsive to the analyzing the frequency selective surface.

17. The method of claim 13, further comprising performing the analysis of the frequency selective surface for a parameter of interest at each of a plurality of parameter values to develop a plurality of corresponding frequency response functions for each parameter value of the plurality.

18. The method of claim 13, further comprising analyzing the frequency response function to determine at least one filter response coefficient selected from the group consisting of major peaks, magnitude, trapezoidal integration of area under the response curve, ratios of user-specified regions of the plot, transient slope and response time of the filter response.

19. A Graphical User Interface (GUI) for modeling, analyzing and designing frequency selective surfaces, comprising:

an interface element for defining a frequency range comprising a plurality of frequency values within the frequency range;

an element for accessing a frequency dependent permittivity for each of the plurality of frequency values across the frequency range for a substrate included in a frequency selective surface;

an element for accessing a frequency dependent conductivity for each of the plurality of frequency values across the frequency range for a conductive material included in the frequency selective surface; and an element for controlling a method of moments analysis module to analyze, at each of the plurality of frequency values, the frequency selective surface for an incident electromagnetic energy impinging on the frequency selective surface by including the frequency dependent permittivity and the frequency dependent conductivity in the method of moments analysis.

20. The GUI of claim 19, further comprising:

an interface element for defining a geometry of the frequency selective surface comprising the substrate and the conductive material disposed on the substrate to form an array of resonance elements; and an interface element for presenting an emissivity of the frequency selective surface at each of the plurality of frequency values responsive to the method of moments analysis.

21. The GUI of claim 19, wherein the element for controlling the method of moments analysis module further comprises performing the analysis of the frequency selective surface for a parameter of interest at each of a plurality of parameter values to develop a plurality of corresponding frequency response functions for each parameter value of the plurality.

22. A non-transitory computer readable media including computer executable instructions, which when executed on a processor perform acts, comprising:

defining a frequency range comprising a plurality of frequency values within the frequency range;

determining a frequency dependent permittivity for each of the plurality of frequency values across the frequency range for a substrate included in a frequency selective surface;

determining a frequency dependent conductivity for each of the plurality of frequency values across the frequency range for a conductive material included in a frequency selective surface; and analyzing the frequency selective surface using a method of moments analysis at each of the plurality of frequency values for an incident electromagnetic energy impinging on the frequency selective surface by including the frequency dependent permittivity and the frequency dependent conductivity in the method of moments analysis to develop a frequency response function.

23. The computer readable media of claim 22, wherein the computer executable instructions further cause the processor to perform acts, comprising:

defining a geometry of the frequency selective surface comprising the substrate and the conductive material disposed on the substrate to form an array of resonance elements; and determining an emissivity of the frequency selective surface at each of the plurality of frequency values responsive to the analysis of the frequency selective surface.

24. The computer readable media of claim 22, wherein the computer executable instructions further cause the processor to perform the analysis of the frequency selective surface for a parameter of interest at each of a plurality of parameter values to develop a plurality of corresponding frequency response functions for each parameter value of the plurality.

25. An apparatus, comprising:

a frequency selective surface comprising a pattern of conductive material formed on a substrate to form an array of resonance elements; and wherein at least one aspect of the frequency selective surface is determined by:

defining a frequency range comprising a plurality of frequency values within the frequency range;

determining a frequency dependent permittivity for each of the plurality of frequency values across the frequency range for the substrate;

determining a frequency dependent conductivity for each of the plurality of frequency values across the frequency range for the conductive material; and analyzing the frequency selective surface using a method of moments analysis at each of the plurality of frequency values for an incident electromagnetic energy impinging on the frequency selective surface by including the frequency dependent permittivity and the frequency dependent conductivity in the method of moments analysis to develop a frequency response function.

26. The apparatus of claim 22, wherein the substrate comprises a dielectric material selected from the group consisting of polyethylene, polypropylene, acrylic, fluoropolymer, polystyrene, polymethyl methacrylate, polyethylene terephthalate, polyimide, polyolefin, silicon, and gallium arsenide.

27. The apparatus of claim 25, wherein the conductive material is selected from the group consisting of manganese, gold, silver, copper, aluminum, platinum, nickel, iron, lead, tin.

28. The apparatus of claim 25, wherein each of the resonance elements comprises a geometry for the pattern of conductive material selected from the group consisting of square loops, circular loops, concentric loops, square spirals, circular spirals, slots, and crosses.

* * * * *

UNITED STATES PATENT AND TRADEMARK OFFICE
CERTIFICATE OF CORRECTION

PATENT NO. : 7,792,644 B2  Page 1 of 1
APPLICATION NO. : 11/939358
DATED : September 7, 2010
INVENTOR(S) : Dale K. Kotter and David T. Rohrbaugh It is certified that error appears in the above-identified patent and that said Letters Patent is hereby corrected as shown below:

In the specification:
COLUMN 9, LINE 12, change "show the" to --show--

In the claims:
CLAIM 26, COLUMN 16, LINE 19, change "22," to --25,--

Signed and Sealed this
Thirtieth Day of July, 2013

Teresa Stanek Rea
*Acting Director of the United States Patent and Trademark Office*